(12) United States Patent
Petenyi et al.

(10) Patent No.: US 11,519,974 B1
(45) Date of Patent: Dec. 6, 2022

(54) SYSTEMS AND METHODS FOR IMPROVING ORIENTATION MEASUREMENTS

(71) Applicant: ArcSecond, Inc., San Diego, CA (US)

(72) Inventors: Jozsef Petenyi, San Diego, CA (US); Vaidyanathan P. Ramasarma, San Diego, CA (US)

(73) Assignee: ARCSECOND, INC., San Diego, CA (US)

( * ) Notice: Subject to any disclaimer, the term of this patent is extended or adjusted under 35 U.S.C. 154(b) by 400 days.

(21) Appl. No.: 16/899,441

(22) Filed: Jun. 11, 2020

Related U.S. Application Data

(60) Provisional application No. 62/860,132, filed on Jun. 11, 2019.

(51) Int. Cl.
| | |
|---|---|
| *G01R 33/02* | (2006.01) |
| *G06F 1/16* | (2006.01) |
| *G01P 15/14* | (2013.01) |
| *G01V 7/00* | (2006.01) |

(52) U.S. Cl.
CPC .......... *G01R 33/0206* (2013.01); *G01P 15/14* (2013.01); *G01V 7/00* (2013.01); *G06F 1/163* (2013.01)

(58) Field of Classification Search
CPC .... G01B 7/004; G01C 17/38; G01R 33/0035; G01R 33/0017; G01R 33/34061; G01R 33/0206; G06F 3/017; G06F 3/0346; G06F 3/012; G06F 1/163; A61B 34/20; A61B 2034/2051; G02B 27/017; G01P 15/14; G01V 7/00
See application file for complete search history.

(56) References Cited

U.S. PATENT DOCUMENTS

| | | |
|---|---|---|
| 2009/0055019 A1 | 2/2009 | Steihl et al. |
| 2012/0246795 A1 | 10/2012 | Scheffler et al. |
| 2013/0198867 A1 | 8/2013 | Ricci et al. |
| 2013/0332065 A1 | 12/2013 | Hakim et al. |
| 2014/0172134 A1 | 6/2014 | Meschter |
| 2015/0366504 A1 | 12/2015 | Connor |
| 2018/0180417 A1 | 6/2018 | Askarpour |
| 2018/0238930 A1* | 8/2018 | Nguyen ................. G01P 15/14 |
| 2019/0212359 A1 | 7/2019 | Erivanteev et al. |

(Continued)

*Primary Examiner* — Jermele M Hollington
*Assistant Examiner* — Taqi R Nasir
(74) *Attorney, Agent, or Firm* — Knobbe, Martens, Olson & Bear LLP

(57) ABSTRACT

Systems and methods for determining orientations measurements are provided. In one aspect, the method includes receiving a magnetic field state of an object, receiving a magnetic field measurement associated with the object, receiving an inertial measurement unit (IMU) measurement associated with the object, receiving a previous gravitational state term associated with the object, determining a gravitational acceleration state term based on the IMU measurement and the previous gravitational state term, determining a magnetic field state term based on the IMU measurement, the magnetic field measurement, and the gravitational acceleration term, and determining an orientation of the object using the gravitational acceleration state term and the magnetic field state term. The magnetic field measurement may be received from a magnetometer, and the IMU measurement may be received from a gyroscope and an accelerometer.

17 Claims, 3 Drawing Sheets

(56) References Cited

U.S. PATENT DOCUMENTS

| | | | |
|---|---|---|---|
| 2019/0219395 A1* | 7/2019 | Fox | G01C 21/16 |
| 2020/0000377 A1 | 1/2020 | Ly et al. | |
| 2020/0065433 A1* | 2/2020 | Duff | G01S 19/48 |
| 2020/0104433 A1* | 4/2020 | Santarone | G06F 30/13 |

* cited by examiner

SYSTEMS AND METHODS FOR IMPROVING ORIENTATION MEASUREMENTS

REFERENCE TO PRIORITY APPLICATIONS

Any and all applications for which a foreign or domestic priority claim is identified in the Application Data Sheet as filed with the present application are hereby incorporated by reference under 37 CFR 1.57.

This application claims the benefit of U.S. Provisional Application No. 62/860,132 filed on Jun. 11, 2019, and titled "SYSTEMS AND METHODS FOR IMPROVING ORIENTATION MEASUREMENTS." The entire disclosure of each of the above items is hereby made part of this specification as if set forth fully herein and incorporated by reference for all purposes, for all that it contains.

TECHNICAL FIELD

The systems and methods disclosed herein are directed to orientation measurement systems, and in particular, to sensors that can measure the orientation of rigid bodies.

BACKGROUND

A background is provided for introductory purposes and to aid the reader in understanding the detailed description. The background should not be taken as an admission of any prior art to the claims.

Several industries and applications require accurate understanding of the three-dimensional (3D) orientation of a rigid body, or a plurality of rigid bodies, and tracking the orientation for one or more of the rigid bodies over time without loss in accuracy. In various implementations, examples of "rigid bodies" include the human body or an object. Maintaining a sufficient accuracy in the orientation may be difficult in noisy environments. The unpredictability of the dynamic nature of any environment makes it challenging to derive accurate orientation estimation(s) of the rigid bodies, much less, accurately tracking the orientation(s) over time without a dilution in precision. Examples of dynamic environmental properties that may affect the accuracy of orientation estimate(s) and/or tracking of the orientations(s) of rigid bodies include, but are not limited to, physical, thermal, electric, magnetic, radio, and/or other types of noise, interferences, and/or disturbances. In addition, tracking orientation of a rigid body should not impede the movement of the rigid body, nor can the movement of the rigid body impede the tracking system.

Maintaining a sufficient accuracy of an orientation measurement can become even more difficult to achieve in consumer electronics devices or other devices which are price-sensitive and limited by size. These price/size limitations can limit the available components that can be used in the measurement device(s) to cheaper and smaller sensors based on micro-electro-mechanical systems (MEMS) technology. MEMS-based sensors may have a performance that is compromised in real-world scenarios, unless the sensed measurements are adequately compensated. Accordingly, what is needed is a system and process for accurately estimating orientation of a rigid that overcomes these and other disadvantages of current tracking systems.

SUMMARY

The apparatus and devices ("systems"), and methods, of this disclosure each have several innovative aspects, no single one of which is solely responsible for the desirable attributes disclosed herein. Various embodiments of the apparatus and methods can include, one, all, or any combination of features of this paragraph.

In one aspect, there is provided a method to estimate the orientation of an object in free space or one that is attached to a rigid body. The method may involve using angular velocity, linear acceleration and magnetic field information to derive the orientation. The orientation estimation can mitigate the undesirable effects of magnetic disturbances, thereby improving accuracy of the estimation. In some embodiments, disturbances in linear acceleration and soft iron effects can be suppressed by Kalman-filters using Markov chains in the measurement models. The method can also provide a gyroscope bias output. The method can also provide the attitude (e.g., a rotation with respect to the horizontal plane) devoid of magnetic disturbances. The object can be attached to a rigid body, and the rigid body can be terrestrial, airborne, underwater, and/or in space. The method can provide gravity-free acceleration and magnetic disturbance outputs. Raw sensor data can be generated from simulated orientations in order to tune the method. The simulated orientations can be derived from a system other than the system which uses the method itself. The raw sensor data can be derived by making specific known or expected patterns in movement of the rigid body. The raw sensor data can be derived in an ambient operating environment that is substantially devoid of noise, interference, and/or disturbances otherwise present in the real world. The raw sensor data can be derived by a system that is autonomous. In some embodiments, the raw sensor data can be derived and classified according to a library of artificially-created environments based on real world understanding of how such environments perform in relation to noise, interference, and/or other disturbances. In some embodiments, magnetic field parameters can be generated in a real or artificially-created realistic environments to derive simulated orientations. In some embodiments, the method can be used to visualize the effect of magnetic field on the simulated orientation of the rigid body.

One innovation includes a method for determining an orientation of an object, the method including receiving a magnetic field state of an object, receiving a magnetic field measurement determining a gravitational term associated with the object, receiving an inertial measurement unit (IMU) measurement associated with the object, receiving a previous gravitational state term associated with the object, determining the gravitational acceleration state term, determining, by a first nonlinear estimator, a gravitational acceleration state term; determining a magnetic field state term, and determining the orientation of the object by solving Wahba's problem using the gravitational acceleration state term and the magnetic field state term.

Such methods can include one or more other aspects. In some embodiments, the magnetic field measurement is received from a magnetometer. In some embodiments, the IMU measurement is received from a gyroscope and an accelerometer. In some embodiments, the method can further comprise determining free acceleration using the determined gravitational state term. In some embodiments, the method can further comprise determining gyroscope bias using the determined gravitational state term. In some embodiments, determining a gravitational acceleration state term comprises determining a gravitational acceleration state term using the IMU measurement, the previous gravitational state term, and a first order Markov chain value. In some embodiments, the gravitational state estimation is done with a nonlinear estimator. In some embodiments, the gravitational state estimation is done with a nonlinear estimator which is an Extended Kalman-filter (EKF). In some embodiments, the gravitational state EKF incorporates the Markov chain in the state model. In some embodiments, the method further comprises determining a magnetic field state term comprising determining a magnetic field state term by performing a magnetic field measurement validation using the gravitational acceleration state term, the magnetic field measurement, and the IMU measurements as input, in response to validating the magnetic field measurement, determining by a second nonlinear estimator the magnetic field state term using the previous magnetic field state, the magnetic field measurement, and a first order Markov chain value, and in response to the magnetic field measurement not being valid, using dead reckoning on each of the magnetic field states and covariance. In some embodiments, the magnetic field state estimation is done with a nonlinear estimator which is an Extended Kalman-filter (EKF). In some embodiments, the magnetic field state EKF incorporates the Markov chain in the state model. In some embodiments, the method further comprises determining magnetic disturbance using the determined magnetic field state term. In some embodiments, determining the orientation with the estimated gravitational state and magnetic field state includes determining the orientation with the estimated gravitational state and magnetic field state as a vector observation problem. In some embodiments, determining the orientation with the estimated gravitational state and magnetic field state includes determining the orientation with the estimated gravitational state and magnetic field state by solving Wahba's problem. In some embodiments, determining the orientation with the estimated gravitational state and magnetic field state includes determining the orientation with the estimated gravitational state and magnetic field state such that the magnetic field state only influences the heading and the gravitational acceleration state only influences the horizontal component of the orientation. In some embodiments, determining the orientation with the estimated gravitational state and magnetic field state includes determining the orientation with the estimated gravitational state and magnetic field state using an algebraic quaternion algorithm (AQUA). An example of AQUA is described in "A Linear Kalman Filter for MARG Orientation Estimation Using the Algebraic Quaternion Algorithm," Valenti, R. G., Dryanovski, I., & Xiao, J. IEEE Transactions on Instrumentation and Measurement, (2016).65(2), 467-481, which is incorporated by reference herein.

DETAILED DESCRIPTION OF CERTAIN INVENTIVE ASPECTS

Figure 1:
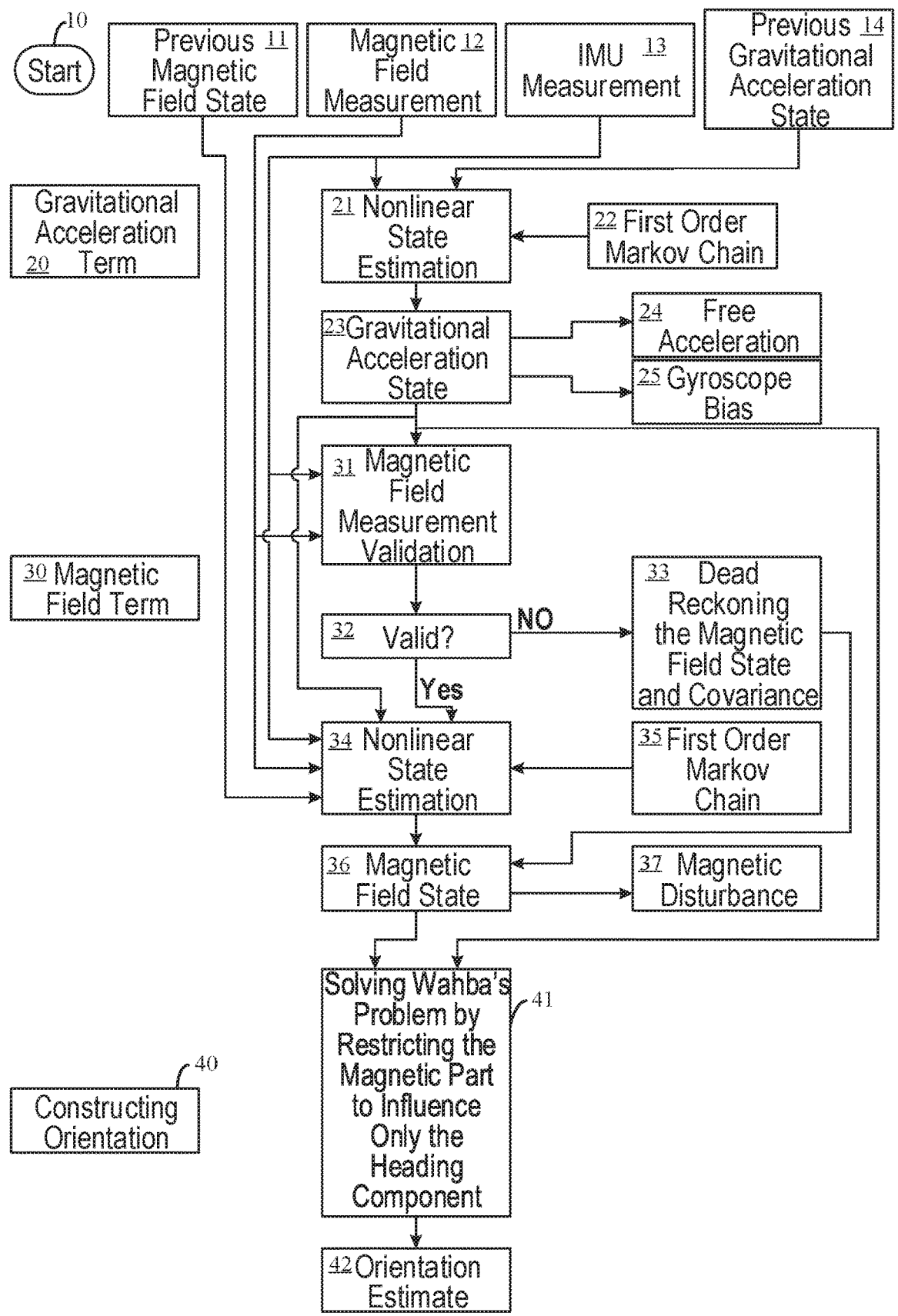
FIG. 1 illustrates an example flowchart which illustrates an ARHS-based orientation estimation process in accordance with aspects of this disclosure.

There is a need for the estimation of the orientation for rigid bodies across several industries such as: defense, transportation, healthcare, and consumer electronics. Example devices and/or applications for orientation estimation include: augmented reality devices, virtual reality devices, satellites, terrestrial objects, underwater objects, aerial objects, handheld computing devices, robotics, wearable devices, apparel, apparel accessories, attitude and heading reference systems (AHRS), and inertial measurement units (IMU's). Aspects of this disclosure relate to systems and methods that can be used to mitigate for at least some of the above-described limitations in accuracy and performance while deriving measurements of the absolute orientation of rigid bodies using magnetic, angular rate and gravity (MARG) sensors. MARG sensors may also be referred to as attitude and heading reference systems. Such systems can track the orientation for one or more of the rigid bodies over time without loss in accuracy, and maintain sufficient accuracy in difficult in noisy environments. For example, "noise" that is caused by physical, thermal, electric, magnetic, radio and/or other types of noise, interferences, and/or disturbances. Such systems can be made small using price effective components, while still determining orientation with high accuracy.

In one embodiment of a system that can benefit from the techniques described herein is a garment having a sensor array. The garment may be configured such that when worn by a person, the garment covers a portion of the person's feet, shins, femurs, and sacrum. In an example, the sensor array can include seven sensors, although in some embodiments the sensor array includes more than seven sensors, or less than seven sensors. The sensor array can be positioned on the garment such that sensors of the sensor array area aligned with the person's feet, shins, femurs, and sacrum. The sensors of the sensor array can include an accelerometer, a gyroscope, and/or a magnetometer. In some embodiments, the sensors of the sensor array all include the same sensors (e.g., an accelerometer, a gyroscope, and a magnetometer). In some embodiments, the sensors of the sensor array are configured at least somewhat differently, that is, a sensor in the sensor array can include one or more different sensors than at least one other sensor in the sensor array. In some embodiments, the sensors in the sensor array include an accelerometer and a magnetometer. In some embodiments, the sensors in the sensor array include an accelerometer and a gyroscope. In some embodiments, the sensors in the sensor array include a gyroscope, and a magnetometer.

The orientation of rigid bodies in three-dimensional (3D) space can be estimated using one or more of several approaches, such as: optical, acoustic, inertial, mechanical, electro-mechanical, magnetic, and/or a hybrid involving several of the aforementioned techniques. While the accuracy involved with each approach may be based on several different factors, none of these techniques are immune to an underlying set of limitations, which include: noise, interference, and other disturbances that any physical environment imposes. For example, in an optical-based system, the ability to have a clear and unobstructed line-of-sight to/from the rigid body directly impacts the accuracy of orientation estimation. Another orientation measurement system may include an IMU-based system, which can include at least a tri-axial accelerometer and a tri-axial gyroscope (together forming a 6-axis IMU), and optionally in addition, a tri-axial magnetometer (together, a 9-axis AHRS). In such IMU-based systems, ambient temperature and the Earth's magnetic field along with fluctuations in each of these environmental physical properties over time can pose significant challenges in obtaining accurate orientation measurements. In addition, the linear acceleration of the rigid body onto which the IMU and/or AHRS may be affixed may pose challenges in estimating orientation accurately. Finally, presence of ferro-magnetic materials in the vicinity of the IMU and/or AHRS can pose challenges to the magnetometer, which can negatively affect accuracy in determining the heading. These challenges may be exacerbated in smaller and mass-produced inertial sensors better suited for consumer electronics applications. As such, such 6-axis IMUs may be incapable of estimating absolute orientation in the absence of 'heading' parameters essential to the calculation, which may only be possible with the inclusion of a magnetometer included in a 9-axis AHRS.

Orientation estimation and orientation tracking of a rigid body or a plurality of rigid bodies using a 9-axis AHRS may require a multi-step approach, taking advantage of individual sensor (e.g., accelerometer, gyroscope, and/or magnetometer) capabilities that help address different parts of the overall problem individually and/or together in pairs. Such approaches are commonly referred to as 'sensor fusion' in the context of small, inexpensive and mass-produced IMUs or AHRS that are based on MEMS technology.

Sensor fusion algorithms may be faced with a number of problems. These problems may be more pronounced in the context of motion associated with the human body. The use of different sensors may each also include different problems.

For example, gyroscopes may be subject to low-frequency 'drift' errors that compound over time. In addition, temperature changes may affect the performance of gyroscopes. Although accelerometers can be used to derive drift-free inclination estimates that can be used as a reference to the gyroscope to mitigate low-frequency drift errors, there may be complexities in such derivation at least in part because the gravity-related component of the calculation can conflict with the linear acceleration of the rigid body itself. Magnetometers can be used to derive drift-free heading estimates, but ferro-magnetic materials in the vicinity of the body can interfere with the output of the magnetometer, impacting the magnetometer's accuracy which is integral to deriving the orientation of the rigid body. Accelerometers and magnetometers, which can be used to mitigate low-frequency drift errors in the gyroscope, may be in-turn prone to high-frequency errors that gyroscopes can help smooth-out.

Several technology approaches including optical, acoustic, inertial, mechanical, electro-mechanical and magnetic have been tried and tested in order to address the need for estimation of rigid body orientation. For example, airplanes and submarines may often use mechanical gyroscopes to cancel-out the undesirable angular momentum of the moving body forced-in by external forces such as wind or water. Mechanical gyroscopes can in-turn help with understanding the orientation of the rigid body either with a known reference plane such as a vertical plane (as in a vertical reference unit (VRU)), or in absolute terms where no such reference may be reliable. In such cases, a combination of accelerometers, gyroscopes and magnetometers are often used.

Unlike price sensitive and/or size-limited consumer electronics applications, other mission critical applications such as in transportation or health can afford larger and highly sensitive sensors that provide accurate estimation of orientation in the presence of noise or other disturbances, as long as such sensors are practical enough to be worn without discomfort. However, such systems are not practical due to cost and/or size in certain applications such as in consumer electronics applications.

Orientation Estimation

In light of the limitations and problems associated with orientation estimation systems described above, aspects of this disclosure relate to a novel orientation estimation method that can be implemented in an AHRS. Embodiments of the orientation estimation method described herein can receive measurements for angular velocity, acceleration, and magnetic field and output orientation. The method can be split into at least two parts which respectively calculate two terms: a gravitational acceleration term and a magnetic field term. In determining each of these terms, a nonlinear state estimator can be designed to give the optimal estimate of the vector observations independently. The method can handle linear acceleration and soft ferro-magnetic disturbances using, for example, Markov chains. Generally, a Markov chain refers to a stochastic model describing a sequence of events in which the probability of each event depends only on the state attained in the previous event. For larger magnetic disturbances, the method can utilize a threshold-based approach. For example, when magnetic disturbances are larger, linear models aren't as accurate. Instead, a broad set of rules can be applied to filter such disturbances. The method can also provide an estimate for the gyroscope bias, which can be insensitive to magnetic disturbances, and the gyroscope bias estimate can be fed back to the algorithms that determine each of the gravitational acceleration and magnetic field terms. Finally, the gravitational acceleration and magnetic field terms can be merged together by ensuring that the attitude (rotation with respect to the horizontal plane; roll, pitch in Euler angles terminology) is not affected by the magnetometer.

FIG. 1 illustrates an example flowchart which illustrates a 9-axis ARHS-based orientation estimation method in accordance with some embodiments. In the first section, Start 10, of the flowchart, previously determined values can be provided as inputs. These values include the previous magnetic field state 11, a magnetic field measurement 12 (e.g., received from a magnetometer), an IMU measurement 13 (e.g., received from the IMU), and the previous gravitational acceleration state 14. An example of data for a previous magnetic field state is shown in Example 1.

previous magnetic field state = 
$$\begin{bmatrix} \text{previous magnetic field estimate } x \text{ axis} \\ \text{previous magnetic field estimate } y \text{ axis} \\ \text{previous magnetic field estimate } z \text{ axis} \\ \text{previous magnetic disturbance estimate } x \text{ axis} \\ \text{previous magnetic disturbance estimate } y \text{ axis} \\ \text{previous magnetic disturbance estimate } z \text{ axis} \end{bmatrix}$$
Example 1

An example of data for a magnetic field measurement is shown in Example 2.

magnetic field measurement = 
$$\begin{bmatrix} \text{measurement from magnetometer } x \text{ axis} \\ \text{measurement from magnetometer } y \text{ axis} \\ \text{measurement from magnetometer } z \text{ axis} \end{bmatrix}$$
Example 2

An example of data for an IMU measurement is shown in Example 3.

$IMU$ measurement = 
$$\begin{bmatrix} \text{measurement from gyroscope } x \text{ axis} \\ \text{measurement from gyroscope } y \text{ axis} \\ \text{measurement from gyroscope } z \text{ axis} \\ \text{measurement from accelerometer } x \text{ axis} \\ \text{measurement from accelerometer } y \text{ axis} \\ \text{measurement from accelerometer } z \text{ axis} \end{bmatrix}$$
Example 3

An example of data for a previous gravitational acceleration state is shown in Example 4.

Example 4 previous gravitational acceleration state =
$$\begin{bmatrix} \text{previous gravitational acceleration estimate } x \text{ axis} \\ \text{previous gravitational acceleration estimate } y \text{ axis} \\ \text{previous gravitational acceleration estimate } z \text{ axis} \\ \text{previous linear acceleration estimate } x \text{ axis} \\ \text{previous linear acceleration estimate } y \text{ axis} \\ \text{previous linear acceleration estimate } z \text{ axis} \\ \text{previous gyroscope bias estimate } x \text{ axis} \\ \text{previous gyroscope bias estimate } y \text{ axis} \\ \text{previous gyroscope bias estimate } z \text{ axis} \end{bmatrix}$$

In the second section of the flowchart, Gravitational Acceleration Term 20, for determining a gravitational acceleration term, a first nonlinear state estimator 21 receives the IMU measurement 13, the previous gravitational acceleration state 14, and a first order Markov chain value as inputs, and outputs a gravitational acceleration state term 23. The gravitational acceleration state term 23 can be used to determine free acceleration 24 and gyroscope bias 25. In order to determine the gravity-free acceleration devoid of gyroscope bias, the following steps are performed: (1) obtain the previous gravitational acceleration state; (2) using a Markov chain approach, determine the non-linear state estimation; (3) derive the gravitational state; and (4) separate the gravity-free acceleration from gyroscope bias. In some embodiments, the first nonlinear estimator can be, for example, an extended Kalman Filter (EKF), or an unscented Kalman Filter (UKF). *Linear and Non-linear Estimation Techniques: Theory and Comparison* (Raja Manish), which is incorporated by reference herein, describes certain examples of an EKF and a UKF that can be used. Other non-linear estimators can be used in other embodiments. Other examples of EKF implementations are disclosed in "Quaternion-based extended Kalman filter for determining orientation by inertial and magnetic sensing," Sabatini, A. M. (2006) IEEE Transactions on Biomedical Engineering, 53(7) 1346-1356, and "Attitude Estimation from Vector Observations Using a Genetic-Algorithm-Embedded Quaternion Particle Filter," Oshman, Y., & Carmi, A. (2006), Journal of Guidance, Control, and Dynamics, 29(4) 879-891, both of which are incorporated by reference herein. Various embodiments can use other implementations.

In the third section of the flowchart, Magnetic Field Term 30, for determining a magnetic field state term, a magnetic field measurement validation 31 is performed using the gravitational acceleration state term 23, the magnetic field measurement 12, and the IMU measurement 13 as inputs. Validity of the magnetic field measurement can be determined by thresholding the length (e.g., the amplitude) of the magnetometer measurement(s). For example, by comparing the magnetic field measurements to predetermined values from previously measured values that are stored, e.g., in a lookup table or other data structure.

When the magnetic field measurement 12 is valid at block 32, a second nonlinear state estimator 34 receives the previous magnetic field state 11, the magnetic field measurement 12, the IMU measurement 13, and a first order Markov chain value 35 as inputs and outputs a magnetic field state value 36. The magnetic field state value 36 can be used to determine magnetic disturbance 37. When the magnetic field measurement is not valid at block 32, dead reckoning may be used on each of the magnetic field state 32 and covariance. In some examples of dead reckoning, gyroscope readings (rate of rotation) are used to rotate the previous estimates and use these values as new estimates. It's important that that covariances are dead reckoned as well. The covariances indicate the confidence of a measurement. For example, for a large confidence initially, after dead reckoning it's smaller due to the estimation (rather than measured values) used in dead reckoning. In this particular case dead reckoning may be done by taking into consideration the rigid body kinematics.

For the magnetic field term 30, the nonlinear state estimation 34 determines and outputs the magnetic field state value 36 which includes a previous magnetic field estimate x axis, a previous magnetic field estimate y axis, a previous magnetic field estimate z axis, a previous magnetic disturbance estimate x axis, a previous magnetic disturbance estimate y axis, and a previous magnetic disturbance estimate z axis. The previous magnetic field estimate x axis, a previous magnetic field estimate y axis, a previous magnetic field estimate z axis are used to determine the magnetic field state value 36. The previous magnetic disturbance estimate x axis, a previous magnetic disturbance estimate y axis, and a previous magnetic disturbance estimate z axis may be used to help improve the accuracy. In the nonlinear state estimation 34 an extended Kalman filter may be implemented and Markov chains used to improve the sensor model and thus the accuracy, and the kinematics of the rigid body movement is accounted for too. In one example, one or more of the techniques described in "Dealing with Magnetic Disturbances in Human Motion Capture: A survey of Techniques" can be used for determining the magnetic field state value, and improving the accuracy. "Dealing with Magnetic Disturbances in Human Motion Capture: A survey of Techniques" to Ligorio, G., & Sabatini, A. M. (2016); Micromachines, 7(3); is incorporated by reference herein.

In the fourth section, Constructing Orientation 40, the orientation estimate can be determined by solving Wahba's problem using the gravitational acceleration state term 23 and the magnetic field state value 36 as inputs. Wahba's problem generally seeks to find a rotation matrix (special orthogonal matrix) between two coordinate systems from a set of (weighted) vector observations. In some embodiments, the cost function that Wahba's problem seeks to minimize is as follows:

$$J(R) = \frac{1}{2} \sum_{k=1}^{N} a_k \|w_k - Rv_k\|^2$$

where $w_k$ is the k-th 3-vector measurement in the reference frame, $v_k$ is the corresponding k-th 3-vector measurement in the body frame and R is a 3 by 3 rotation matrix between the coordinate frames. $a_k$ is an optional set of weights for each observation. Wahba's problem can be solved using AQUA to calculate the quaternion, which is described, for example, in "A Linear Kalman Filter for MARG Orientation Estimation Using the Algebraic Quaternion Algorithm" mentioned above. In some examples, the cost function is modified according to the AQUA algorithm. Other ways of solving Wahba's problem includes, for example, using a QUEST algorithm. In some embodiments, solving Wahba's problem may involve restricting the magnetic part to influence only the heading component of the orientation estimate. Wahba's problem may seek to find the orientation if several observations are available. For example, Wahba's problem may receive two reference vectors (e.g., vectors from the accelerometer and the magnetometer) to estimate orientation. Since the magnetometer may not be sufficiently reliable, Wahba's problem can be used to prevent the magnetometer vector from interfering with the estimation of the horizontal plane.

Figure 2:
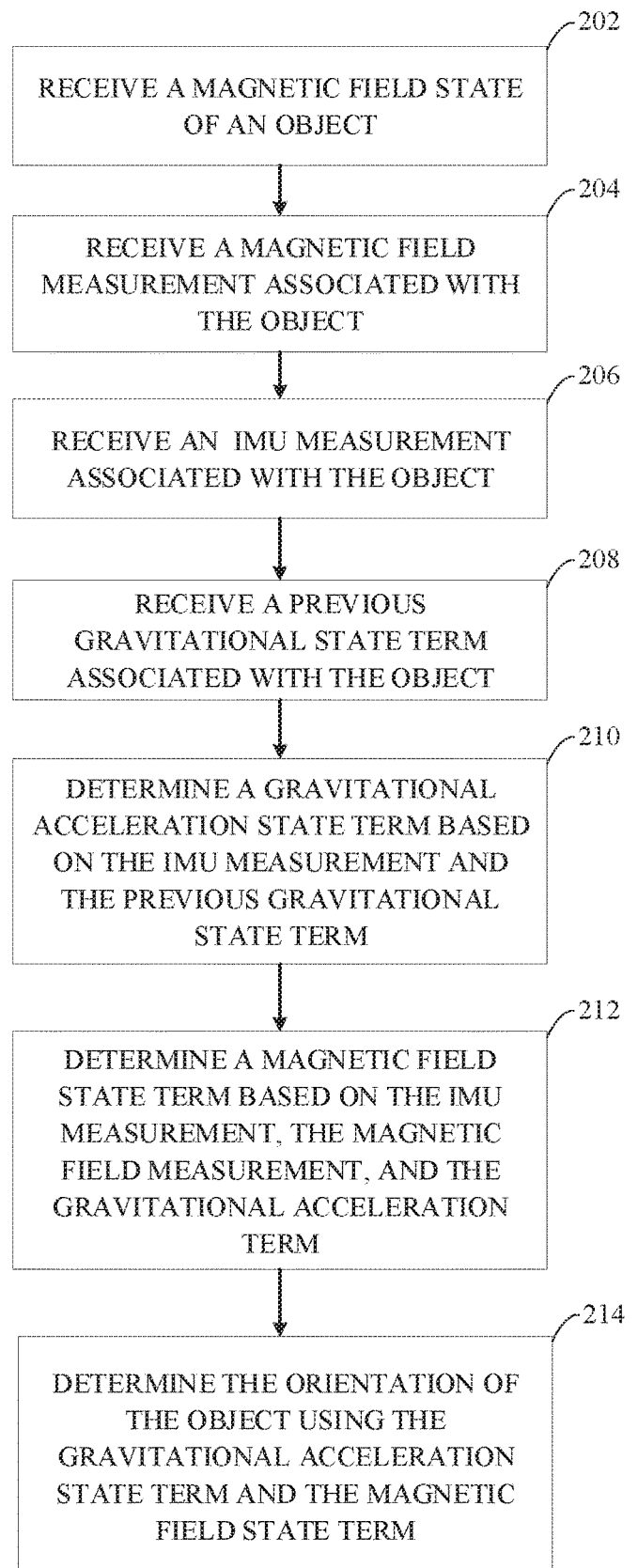
FIG. 2 illustrates a flow chart of a method of determining an orientation of an object, according to some embodiments.

FIG. 2 illustrates a flow chart of a method of determining an orientation of an object, according to some embodiments. At block 202 of the method, a magnetic field state of an object is received The magnetic field state can indicate a previous magnetic field state of the object at any previous time. The previous magnetic field state may include, for example, a previous magnetic field estimate x axis, a previous magnetic field estimate y axis, a previous magnetic field estimate z axis, a previous magnetic disturbance estimate x axis, a previous magnetic disturbance estimate y axis, and a previous magnetic disturbance estimate z axis.

At block 204 of the method, a magnetic field measurement associated with the object is received. The magnetic field measurement can include, for example, a x axis measurement from a magnetometer, a y axis measurement from a magnetometer, a y axis measurement from a magnetometer, and a z axis measurement from a magnetometer. The magnetometer can be, for example, coupled to the object or incorporated in the object, or otherwise sense the provided magnetic field measurements of the object.

At block 206 of the method, an IMU measurement associated with the object is received. The IMU measurement can include, for example, a x axis gyroscope measurement, a y axis gyroscope measurement, a z axis gyroscope measurement, a x axis accelerometer measurement, a y axis accelerometer measurement, and a z axis accelerometer measurement. The gyroscope and the accelerometer can be, for example, coupled to the object or incorporated in the object, or otherwise sense the provided gyroscope and accelerometer measurements of the object.

At block 208 of the method a previous gravitational state term associated with the object is received. The previous gravitational state term may include, for example, a x axis previous gravitational acceleration estimate, a y axis previous gravitational acceleration estimate, a z axis previous gravitational acceleration estimate, a x axis previous linear acceleration estimate, a y axis previous linear acceleration estimate, a z axis previous linear acceleration estimate, a x axis previous gyroscope bias estimate, a y axis previous gyroscope bias estimate, and a z axis previous gyroscope bias estimate.

At block 210 of the method a gravitational acceleration state term is determined based on the IMU measurement and the previous gravitational state term. At block 212 of the method a magnetic field state term is determined based on the IMU measurement, the magnetic field measurement, and the gravitational acceleration state term. At block 214 of the method an orientation of the object using the gravitational acceleration state term and the magnetic field state term is determined.

In some embodiments, the method can further comprise determining free acceleration and gyroscope bias using the determined gravitational state term. Also, the method can determine a gravitational acceleration state term comprises determining a gravitational acceleration state term using the IMU measurement, the previous gravitational state term, and a first order Markov chain value. In some embodiments, the method determines the orientation of the object is determined by solving Wahba's problem using the gravitational acceleration state term and the magnetic field state term. In some embodiments, determining the gravitational state acceleration state term includes using a nonlinear estimator to determine the gravitational state acceleration state term. In some embodiments, the nonlinear estimator comprises an Extended Kalman-filter (EKF). The method can further include receiving a first order Markov chain associated with the object, wherein the nonlinear estimator determines the gravitational state term using a first order Markov chain.

In some embodiments, the method determines a magnetic field state term by validating the magnetic field measurement using the gravitational acceleration state term, the magnetic field measurement, and the IMU measurements. If the magnetic field measurement is valid, the method can determine by a second nonlinear estimator the magnetic field state term using the previous magnetic field state, the magnetic field measurement, and a first order Markov chain value. If the method magnetic field measurement is not valid, the method can determine the magnetic field measurement using dead reckoning on each of the magnetic field states and covariance. In some embodiments, second nonlinear estimator comprises an Extended Kalman-filter (EKF). In some embodiments, the Extended Kalman-filter of the second nonlinear estimator incorporates the Markov chain in the state model to determine the magnetic field state. In some embodiments, the method can determine magnetic disturbance using the determined magnetic field state term. In some embodiments, the orientation of the object is determined using the magnetic field state term to only influence a heading of the object. In some embodiments, the orientation of the object is determined using the gravitational acceleration state term to only influence a horizontal component of the orientation. In some embodiments, determining the orientation of the object is done solving Wahba's problem using the gravitational acceleration state term and the magnetic field state term, and wherein an algebraic quaternion algorithm (AQUA) to solve Wahba's problem.

Depending on the implementation, the systems and methods described herein can be implemented using linear quadratic estimation algorithms such as particle, Bayesian, linear Kalman, unscented Kalman algorithms. The described technology can also be implemented using any frequency domain filter. In some embodiments, the described technology can be implemented using Markov chains of a different order (e.g., second order, third order, etc.). In some implementations, the magnetic term can be ignored, leaving a vertical reference unit (VRU) as well as an IMU which can be used for various applications. In certain embodiments, Wahba's problem can be solved by any other approaches such as the TRIAD method, Devenport's 'q-method', singular value decomposition-based methods, and the quaternion estimation (QUEST) batch attitude algorithm. The QUEST algorithm, which works with vector attitude observations, serves as a starting point because it is able to work with a poor, or no, first guess of the attitude. It is able to do this because its nonlinear estimation problem can be solved exactly by solving an eigenvalue/eigenvector problem.

Additional Implementation Details and Embodiments

In an implementation one or more aspects of the orientation measurement system may comprise, or be implemented in, a "virtual computing environment." As used herein, the term "virtual computing environment" should be construed broadly to include, for example, computer readable program instructions executed by one or more processors (e.g., as described in the example of FIG. 9) to implement one or more aspects of the modules and/or functionality described herein. Further, in this implementation, one or more modules/engines/etc. of the orientation measurement system may be understood as comprising one or more rules engines of the virtual computing environment that, in response to inputs received by the virtual computing environment, execute rules and/or other program instructions to modify operation of the virtual computing environment. Such functionality may comprise a modification of the operation of the virtual computing environment in response to inputs and according to various rules. Other functionality implemented by the virtual computing environment (as described throughout this disclosure) may further comprise modifications of the operation of the virtual computing environment, for example, the operation of the virtual computing environment may change depending on the information gathered by the orientation measurement system. Initial operation of the virtual computing environment may be understood as an establishment of the virtual computing environment. In some implementations the virtual computing environment may comprise one or more virtual machines, containers, and/or other types of emulations of computing systems or environments. In some implementations the virtual computing environment may comprise a hosted computing environment that includes a collection of physical computing resources that may be remotely accessible and may be rapidly provisioned as needed (commonly referred to as "cloud" computing environment).

Various embodiments of the present disclosure may be a system, a method, and/or a computer program product at any possible technical detail level of integration. The computer program product may include a computer readable storage medium (or mediums) having computer readable program instructions thereon for causing a processor to carry out aspects of the present disclosure.

For example, the functionality described herein may be performed as software instructions are executed by, and/or in response to software instructions being executed by, one or more hardware processors and/or any other suitable computing devices. The software instructions and/or other executable code may be read from a computer readable storage medium (or mediums).

The computer readable storage medium can be a tangible device that can retain and store data and/or instructions for use by an instruction execution device. The computer readable storage medium may be, for example, but is not limited to, an electronic storage device (including any volatile and/or non-volatile electronic storage devices), a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a solid state drive, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions (as also referred to herein as, for example, "code," "instructions," "module," "application," "software application," and/or the like) for carrying out operations of the present disclosure may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. Computer readable program instructions may be callable from other instructions or from itself, and/or may be invoked in response to detected events or interrupts. Computer readable program instructions configured for execution on computing devices may be provided on a computer readable storage medium, and/or as a digital download (and may be originally stored in a compressed or installable format that requires installation, decompression or decryption prior to execution) that may then be stored on a computer readable storage medium. Such computer readable program instructions may be stored, partially or fully, on a memory device (e.g., a computer readable storage medium) of the executing computing device, for execution by the computing device. The computer readable program instructions may execute entirely on a user's computer (e.g., the executing computing device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart(s) and/or block diagram(s) block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks. For example, the instructions may initially be carried on a magnetic disk or solid state drive of a remote computer. The remote computer may load the instructions and/or modules into its dynamic memory and send the instructions over a telephone, cable, or optical line using a modem. A modem local to a server computing system may receive the data on the telephone/cable/optical line and use a converter device including the appropriate circuitry to place the data on a bus. The bus may carry the data to a memory, from which a processor may retrieve and execute the instructions. The instructions received by the memory may optionally be stored on a storage device (e.g., a solid state drive) either before or after execution by the computer processor.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. In addition, certain blocks may be omitted in some implementations. The methods and processes described herein are also not limited to any particular sequence, and the blocks or states relating thereto can be performed in other sequences that are appropriate.

It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. For example, any of the processes, methods, algorithms, elements, blocks, applications, or other functionality (or portions of functionality) described in the preceding sections may be embodied in, and/or fully or partially automated via, electronic hardware such application-specific processors (e.g., application-specific integrated circuits (ASICs)), programmable processors (e.g., field programmable gate arrays (FPGAs)), application-specific circuitry, and/or the like (any of which may also combine custom hard-wired logic, logic circuits, ASICs, FPGAs, etc. with custom programming/execution of software instructions to accomplish the techniques).

Any of the above-mentioned processors, and/or devices incorporating any of the above-mentioned processors, may be referred to herein as, for example, "computers," "computer devices," "computing devices," "hardware computing devices," "hardware processors," "processing units," and/or the like. Computing devices of the above-embodiments may generally (but not necessarily) be controlled and/or coordinated by operating system software, such as Mac OS, iOS, Android, Chrome OS, Windows OS (e.g., Windows XP, Windows Vista, Windows 7, Windows 8, Windows 10, Windows Server, etc.), Windows CE, Unix, Linux, SunOS, Solaris, Blackberry OS, VxWorks, or other suitable operating systems. In other embodiments, the computing devices may be controlled by a proprietary operating system. Conventional operating systems control and schedule computer processes for execution, perform memory management, provide file system, networking, I/O services, and provide a user interface functionality, such as a graphical user interface ("GUI"), among other things.

Figure 3:
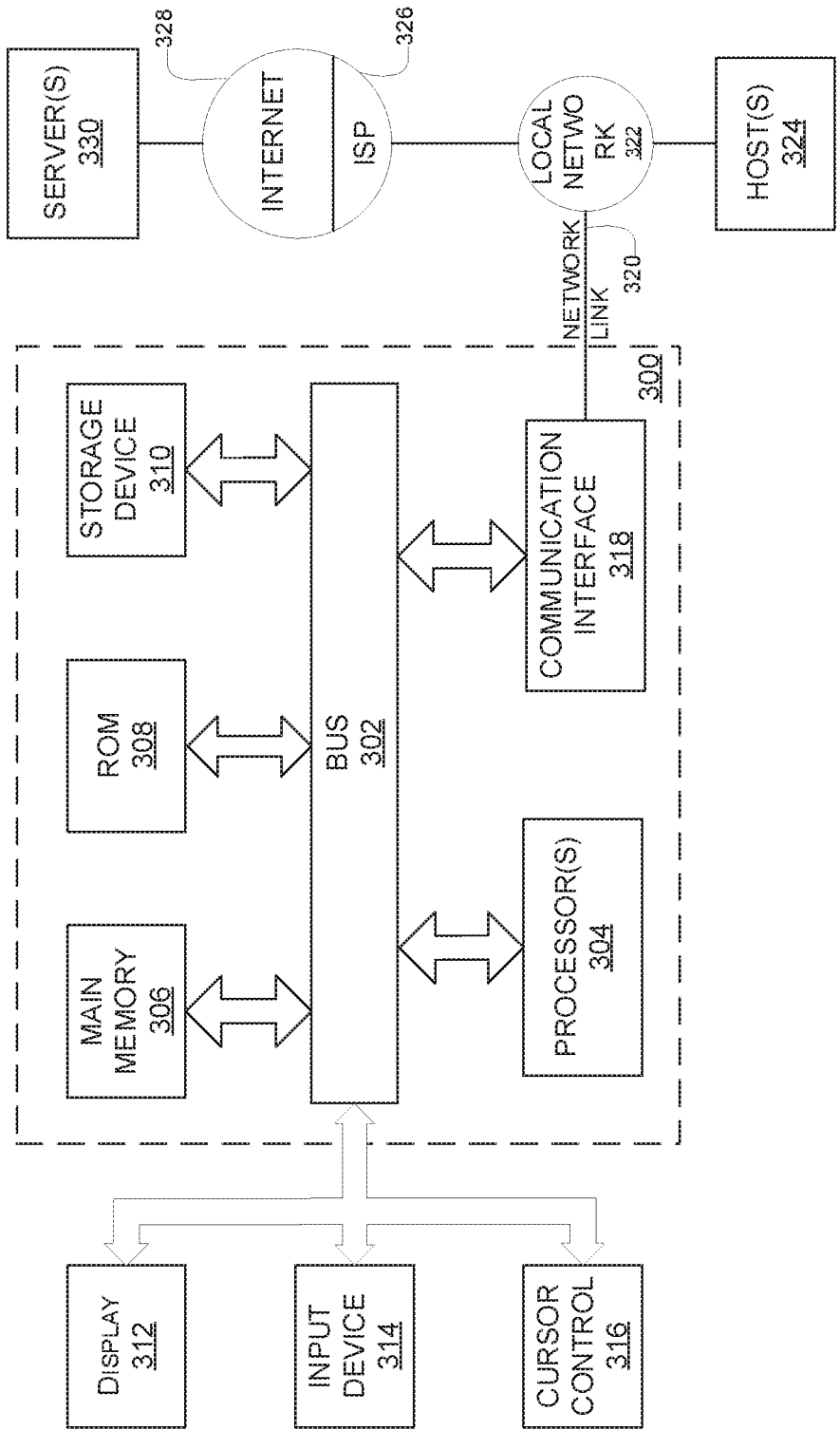
FIG. 3 shows a block diagram that illustrates a computer system upon which various embodiments may be implemented.

For example, FIG. 3 shows a block diagram that illustrates a computer system 900 upon which various embodiments of an orientation measurement system may be implemented. Computer system 300 includes a bus 302 or other communication mechanism for communicating information, and a hardware processor, or multiple processors, 304 coupled with bus 302 for processing information. Hardware processor(s) 304 may be, for example, one or more general purpose microprocessors.

Computer system 300 also includes a main memory 306, such as a random access memory (RAM), cache and/or other dynamic storage devices, coupled to bus 302 for storing information and instructions to be executed by processor 304. Main memory 306 also may be used for storing temporary variables or other intermediate information during execution of instructions to be executed by processor 304. Such instructions, when stored in storage media accessible to processor 304, render computer system 300 into a special-purpose machine that is customized to perform the operations specified in the instructions.

Computer system 300 further includes a read only memory (ROM) 308 or other static storage device coupled to bus 302 for storing static information and instructions for processor 304. A storage device 310, such as a magnetic disk, optical disk, or USB thumb drive (Flash drive), etc., is provided and coupled to bus 302 for storing information and instructions.

Computer system 300 may be coupled via bus 302 to a display 312, such as a cathode ray tube (CRT) or LCD display (or touch screen), for displaying information to a computer user. An input device 314, including alphanumeric and other keys, is coupled to bus 302 for communicating information and command selections to processor 304. Another type of user input device is cursor control 316, such as a mouse, a trackball, or cursor direction keys for communicating direction information and command selections to processor 304 and for controlling cursor movement on display 312. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

Computing system 300 may include a user interface module to implement a GUI that may be stored in a mass storage device as computer executable program instructions that are executed by the computing device(s). Computer system 300 may further, as described below, implement the techniques described herein using customized hard-wired logic, one or more ASICs or FPGAs, firmware and/or program logic which in combination with the computer system causes or programs computer system 300 to be a special-purpose machine. According to one embodiment, the techniques herein are performed by computer system 300 in response to processor(s) 304 executing one or more sequences of one or more computer readable program instructions contained in main memory 306. Such instructions may be read into main memory 306 from another storage medium, such as storage device 310. Execution of the sequences of instructions contained in main memory 306 causes processor(s) 304 to perform the process steps described herein. In alternative embodiments, hard-wired circuitry may be used in place of or in combination with software instructions.

Various forms of computer readable storage media may be involved in carrying one or more sequences of one or more computer readable program instructions to processor 304 for execution. For example, the instructions may initially be carried on a magnetic disk or solid state drive of a remote computer. The remote computer can load the instructions into its dynamic memory and send the instructions over a telephone line using a modem. A modem local to computer system 300 can receive the data on the communication line and use an infra-red transmitter to convert the data to an infra-red signal. An infra-red detector can receive the data carried in the infra-red signal and appropriate circuitry can place the data on bus 302. Bus 302 carries the data to main memory 306, from which processor 304 retrieves and executes the instructions. The instructions received by main memory 306 may optionally be stored on storage device 310 either before or after execution by processor 304.

Computer system 300 also includes a communication interface 318 coupled to bus 302. Communication interface 318 provides a two-way data communication coupling to a network link 320 that is connected to a local network 322. For example, communication interface 318 may be an integrated services digital network (ISDN) card, cable modem, satellite modem, or a modem to provide a data communication connection to a corresponding type of telephone line. As another example, communication interface 318 may be a local area network (LAN) card to provide a data communication connection to a compatible LAN (or WAN component to communicated with a WAN). Wireless links may also be implemented. In any such implementation, communication interface 318 sends and receives electrical, electromagnetic or optical signals that carry digital data streams representing various types of information.

Network link 320 typically provides data communication through one or more networks to other data devices. For example, network link 320 may provide a connection through local network 322 to a host computer 324 or to data equipment operated by an Internet Service Provider (ISP) 326. ISP 326 in turn provides data communication services through the world wide packet data communication network now commonly referred to as the "Internet" 328. Local network 322 and Internet 328 both use electrical, electromagnetic or optical signals that carry digital data streams. The signals through the various networks and the signals on network link 320 and through communication interface 318, which carry the digital data to and from computer system 300, are example forms of transmission media.

Computer system 300 can send messages and receive data, including program code, through the network(s), network link 320 and communication interface 318. In the Internet example, a server 330 might transmit a requested code for an application program through Internet 328, ISP 326, local network 322 and communication interface 318.

The received code may be executed by processor 304 as it is received, and/or stored in storage device 310, or other non-volatile storage for later execution.

As described above, in various embodiments certain functionality may be accessible by a user through a web-based viewer (such as a web browser), or other suitable software program). In such implementations, the user interface may be generated by a server computing system and transmitted to a web browser of the user (e.g., running on the user's computing system). Alternatively, data (e.g., user interface data) necessary for generating the user interface may be provided by the server computing system to the browser, where the user interface may be generated (e.g., the user interface data may be executed by a browser accessing a web service and may be configured to render the user interfaces based on the user interface data). The user may then interact with the user interface through the web-browser. User interfaces of certain implementations may be accessible through one or more dedicated software applications. In certain embodiments, one or more of the computing devices and/or systems of the disclosure may include mobile computing devices, and user interfaces may be accessible through such mobile computing devices (for example, smartphones and/or tablets).

Many variations and modifications may be made to the above-described embodiments, the elements of which are to be understood as being among other acceptable examples. All such modifications and variations are intended to be included herein within the scope of this disclosure. The foregoing description details certain embodiments. It will be appreciated, however, that no matter how detailed the foregoing appears in text, the systems and methods can be practiced in many ways. As is also stated above, it should be noted that the use of particular terminology when describing certain features or aspects of the systems and methods should not be taken to imply that the terminology is being re-defined herein to be restricted to including any specific characteristics of the features or aspects of the systems and methods with which that terminology is associated.

Conditional language, such as, among others, "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

The term "substantially" when used in conjunction with the term "real-time" forms a phrase that will be readily understood by a person of ordinary skill in the art. For example, it is readily understood that such language will include speeds in which no or little delay or waiting is discernible, or where such delay is sufficiently short so as not to be disruptive, irritating, or otherwise vexing to a user.

Conjunctive language such as the phrase "at least one of X, Y, and Z," or "at least one of X, Y, or Z," unless specifically stated otherwise, is to be understood with the context as used in general to convey that an item, term, etc. may be either X, Y, or Z, or a combination thereof. For example, the term "or" is used in its inclusive sense (and not in its exclusive sense) so that when used, for example, to connect a list of elements, the term "or" means one, some, or all of the elements in the list. Thus, such conjunctive language is not generally intended to imply that certain embodiments require at least one of X, at least one of Y, and at least one of Z to each be present.

The term "a" as used herein should be given an inclusive rather than exclusive interpretation. For example, unless specifically noted, the term "a" should not be understood to mean "exactly one" or "one and only one"; instead, the term "a" means "one or more" or "at least one," whether used in the claims or elsewhere in the specification and regardless of uses of quantifiers such as "at least one," "one or more," or "a plurality" elsewhere in the claims or specification.

The term "comprising" as used herein should be given an inclusive rather than exclusive interpretation. For example, a general purpose computer comprising one or more processors should not be interpreted as excluding other computer components, and may possibly include such components as memory, input/output devices, and/or network interfaces, among others.

While there have been shown and described and pointed out the fundamental novel features of the invention as applied to certain inventive embodiments, it will be understood that the foregoing is considered as illustrative only of the principles of the invention and not intended to be exhaustive or to limit the invention to the precise forms disclosed. Modifications or variations are possible in light of the above teachings. The embodiments discussed were chosen and described to provide the best illustration of the principles of the invention and its practical application to enable one of ordinary skill in the art to utilize the invention in various embodiments and with various modifications as are suited to the particular use contemplate. All such modifications and variations are within the scope of the invention as determined by the appended claims when interpreted in accordance with the breadth to which they are entitled.

What is claimed is:

1. A method for determining an orientation of an object, the method comprising:
   receiving a magnetic field state of an object;
   receiving a magnetic field measurement associated with the object;
   receiving an inertial measurement unit (IMU) measurement associated with the object;
   receiving a previous gravitational state term associated with the object;
   determining a gravitational acceleration state term based on the IMU measurement and the previous gravitational state term;
   determining a magnetic field state term based on the IMU measurement, the magnetic field measurement, and the gravitational acceleration term; and
   determining an orientation of the object using the gravitational acceleration state term and the magnetic field state term.

2. The method of claim 1, wherein the magnetic field measurement is received from a magnetometer.

3. The method of claim 1, wherein the IMU measurement is received from a gyroscope and an accelerometer.

4. The method of claim 1, further comprising determining free acceleration and gyroscope bias using the determined gravitational state term.

5. The method of claim 1, wherein determining a gravitational acceleration state term comprises determining a gravitational acceleration state term using the IMU measurement, the previous gravitational state term, and a first order Markov chain value.

6. The method of claim 1, wherein determining the orientation of the object is determined by solving Wahba's problem using the gravitational acceleration state term and the magnetic field state term.

7. The method of claim 1, wherein determining the gravitational state acceleration state term comprising using a nonlinear estimator to determine the gravitational state acceleration state term.

8. The method of claim 7, wherein the nonlinear estimator comprises an Extended Kalman-filter (EKF).

9. The method of claim 8, further comprising receiving a first order Markov chain associated with the object, wherein the nonlinear estimator determines the gravitational state term using a first order Markov chain.

10. The method of claim 1, wherein determining a magnetic field state term comprises:
    validating the magnetic field measurement using the gravitational acceleration state term, the magnetic field measurement, and the IMU measurements;
    in response to determining the magnetic field measurement is valid, determining by a second nonlinear estimator the magnetic field state term using the previous magnetic field state, the magnetic field measurement, and a first order Markov chain value, and
    in response to determining the magnetic field measurement is not valid, using dead reckoning on each of the magnetic field states and covariance.

11. The method of claim 10, wherein the second nonlinear estimator comprises an Extended Kalman-filter (EKF).

12. The method of claim 11, wherein the Extended Kalman-filter of the second nonlinear estimator incorporates the Markov chain in the state model to determine the magnetic field state.

13. The method of claim 10, further comprising determining magnetic disturbance using the determined magnetic field state term.

14. The method of claim 1, wherein determining the orientation of the object using the magnetic field state term to only influence a heading of the object.

15. The method of claim 1, wherein determining the orientation of the object using the gravitational acceleration state term to only influence a horizontal component of the orientation.

16. The method of claim 1, wherein determining the orientation of the object is determined by solving Wahba's problem using the gravitational acceleration state term and the magnetic field state term, and wherein an algebraic quaternion algorithm (AQUA) to solve Wahba's problem.

17. The method of claim 1, wherein the object is part of a sensor harness incorporated into a garment.

* * * * *